United States Patent
Zhai et al.

(10) Patent No.: US 11,081,632 B2
(45) Date of Patent: Aug. 3, 2021

(54) MICRO-LED CHIPS AND METHODS FOR MANUFACTURING THE SAME AND DISPLAY DEVICES

(71) Applicant: CHENGDU VISTAR OPTOELECTRONICS CO., LTD., Chengdu (CN)

(72) Inventors: Feng Zhai, Kunshan (CN); Huimin Liu, Kunshan (CN); Tao Wang, Kunshan (CN)

(73) Assignee: CHENGDU VISTAR OPTOELECTRONICS CO., LTD., Chengdu (CN)

( * ) Notice: Subject to any disclaimer, the term of this patent is extended or adjusted under 35 U.S.C. 154(b) by 0 days.

(21) Appl. No.: 16/852,574

(22) Filed: Apr. 20, 2020

(65) Prior Publication Data

US 2020/0251641 A1 Aug. 6, 2020

Related U.S. Application Data

(63) Continuation of application No. PCT/CN2019/083546, filed on Apr. 19, 2019.

(30) Foreign Application Priority Data

Sep. 27, 2018 (CN) .......................... 201811133686.6

(51) Int. Cl.
*H01L 33/62* (2010.01)
*H01L 23/00* (2006.01)
*H01L 25/075* (2006.01)

(52) U.S. Cl.
CPC .............. *H01L 33/62* (2013.01); *H01L 24/27* (2013.01); *H01L 24/29* (2013.01); *H01L 24/83* (2013.01);
(Continued)

(58) Field of Classification Search
CPC ........... H01L 33/62; H01L 2224/27318; H01L 2224/27515; H01L 24/29; H01L 24/32;
(Continued)

(56) References Cited

U.S. PATENT DOCUMENTS

| | | |
|---|---|---|
| 2007/0289706 A1 | 12/2007 | Nakagawa et al. |
| 2014/0210076 A1 | 7/2014 | Aliane |
| 2017/0140701 A1 | 5/2017 | Ogonowsky |

FOREIGN PATENT DOCUMENTS

| | | |
|---|---|---|
| CN | 101090610 A | 12/2007 |
| CN | 104362134 A | 2/2015 |

(Continued)

OTHER PUBLICATIONS

Office Action of CN Patent Application No. 201811133686.6.

*Primary Examiner* — Tucker J Wright
(74) *Attorney, Agent, or Firm* — Kilpatrick Townsend & Stockton LLP

(57) ABSTRACT

The present disclosure relates to micro-LED chips, methods for manufacturing the same, and display devices. The micro-LED chip includes: a driving backplane including at least one first electrode, a groove being provided above the first electrode, and the first electrode being located at a bottom of the groove; the groove being filled with a conductive material, and the conductive material being obtained by curing a corresponding conductive ink; and a light emitting chip including at least one second electrode; and the first electrode is connected to the second electrode through the conductive material.

19 Claims, 10 Drawing Sheets

(52) U.S. Cl.
CPC  *H01L 25/0753* (2013.01); *H01L 2224/27318* (2013.01); *H01L 2224/27515* (2013.01); *H01L 2224/27618* (2013.01); *H01L 2224/29239* (2013.01); *H01L 2224/29247* (2013.01); *H01L 2224/8312* (2013.01); *H01L 2224/8384* (2013.01); *H01L 2933/0066* (2013.01)

(58) Field of Classification Search
CPC .................... H01L 2224/29005–29009; H01L 2224/2901–29019; H01L 2224/2902–29036; H01L 2224/3201–32014; H01L 2224/321–32268; H01L 2224/325–32507; H01L 2224/04026; H01L 2224/32151–32268
See application file for complete search history.

(56) References Cited

FOREIGN PATENT DOCUMENTS

| | | |
|---|---|---|
| CN | 106847716 A | 6/2017 |
| CN | 107978665 A | 5/2018 |
| CN | 108365080 A | 8/2018 |

MICRO-LED CHIPS AND METHODS FOR MANUFACTURING THE SAME AND DISPLAY DEVICES

CROSS-REFERENCES TO RELATED APPLICATIONS

This application is a continuation application for International Application PCT/CN2019/083546, filed on Apr. 19, 2019, which claims priority to Chinese Patent Applications No. 201811133686.6, entitled "MICRO-LED CHIPS AND METHODS FOR MANUFACTURING THE SAME AND DISPLAY DEVICE", filed on Sep. 27, 2018.

The contents of these applications are incorporated by reference herein for all purposes.

TECHNICAL FIELD

The present disclosure relates to the technical field of display technologies.

BACKGROUND

Micro-LED chip is a new type of display chip, which has the characteristics of self-luminescence, thin, high efficiency, high brightness, high resolution, fast reaction time, etc., and is therefore increasingly applied to display and illumination.

SUMMARY

Embodiments of the disclosure provide micro-LED chips, methods for manufacturing the same, and display devices. An embodiment of the disclosure provides a micro-LED chip, including: a driving backplane including at least one first electrode, a groove being provide above the first electrode, and the first electrode being located at a bottom of the groove; the groove being filled with a conductive material, and the conductive material being obtained by curing a corresponding conductive ink; and a light emitting chip including at least one second electrode; and the first electrode being connected to the second electrode through the conductive material.

Optionally, the at least one first electrode includes a plurality of first electrodes, a plurality of grooves are formed on the plurality of first electrodes, respectively, and tops of the plurality of grooves are located on the same horizontal plane.

Optionally, a height of the conductive material filled in the groove is less than a depth of the groove.

Optionally, a shape of a cross-section of the groove in a direction of a thickness of the driving backplane is arcuate, rectangular, or trapezoidal.

Optionally, the conductive ink is a nano silver wire conductive ink or a nano copper wire conductive ink.

An embodiment of the disclosure provides a method for manufacturing a micro-LED chip, including: providing a driving backplane and a light emitting chip, the driving backplane includes at least one first electrode, and the light emitting chip includes at least one second electrode; forming a groove above the first electrode, the first electrode is exposed at a bottom of the groove; printing a conductive ink into the groove; aligning and contacting the second electrode with the conductive ink in the groove; and curing the conductive ink, the second electrode is connected to the first electrode through the cured conductive ink.

Optionally, the at least one first electrode includes a plurality of first electrodes, and the forming the groove above the first electrode includes: forming a plurality of grooves above the plurality of first electrodes, tops of different grooves are located on the same horizontal plane.

Optionally, a shape of a cross-section of the groove in a direction of a thickness of the driving backplane is arcuate, rectangular, or trapezoidal.

Optionally, the forming the groove above the first electrode includes: coating a photoresist on the first electrode; patterning the photoresist to form the groove above the photoresist corresponding to the first electrode.

Optionally, patterning the photoresist includes: exposing, developing, and cleaning the photoresist.

Optionally, the printing the printing ink into the groove includes: printing the conductive ink into the groove by ink jet printing.

Optionally, the printing the printing ink into the groove includes: printing a conductive ink precursor into the groove by ink jet printing; photon sintering the conductive ink precursor to obtain the conductive ink.

Optionally, the photon sintering is performed using a laser.

Optionally, the conductive ink is nano silver wire conductive ink or nano copper wire conductive ink.

Optionally, when a height of the conductive ink is equal to a set height, stopping the printing, and the set height is less than a height of the top of the groove.

Optionally, the set height is determined according to a concentration of the conductive ink.

Optionally, the aligning and contacting the second electrode with the conductive ink in the groove includes: aligning and contacting the second electrode with the conductive ink in the groove, and immersing the second electrode in the conductive ink.

Optionally, the curing the conductive ink includes: performing infrared sintering treatment to the conductive ink, and converting the conductive ink into a conductive material, such that the second electrode is connected to the first electrode through the conductive material.

An embodiment of the disclosure provides a display device, including the foregoing micro-LED chip or the micro-LED chip manufactured according to the foregoing method.

The foregoing at least one technical solution adopted by the exemplary embodiments of the disclosure can achieve the following beneficial effects:

(1) By forming a groove above the side of the first electrode side of the driving backplane, and printing the conductive ink into the groove, the second electrode of the light emitting chip is connected to the first electrode of the driving backplane by the conductive material formed after curing the conductive ink. Compared with directly welding the second electrode of the light emitting chip to the first electrode of the driving backplane, the first electrode and the second electrode have better contact with the cured conductive material. Therefore, the contact performance between the second electrode of the light emitting chip and the first electrode of the driving backplane can be effectively improved, and the reliability of connection between the first electrode and the second electrode can be improved.

(2) By printing the conductive ink into the groove, the groove can protect the cured conductive material from falling off.

(3) The alignment accuracy is high and the electrode connection is less than 20 micron.

(4) The height of the conductive ink printed in different grooves may be at the same level when printing the conductive ink into the grooves above the side where the first electrode of the driving backplane is located. As such, when the second electrode of the light emitting chip is connected to the first electrode of the driving backplane, the second electrode of the light emitting chip can be effectively connected to the first electrode of the driving backplane by conducting ink on the same horizontal plane, thereby avoiding a problem that the plurality of first electrodes of the driving backplane, due to a large difference in height therebetween, cannot be effectively connected to the second electrodes of the light emitting chip.

DETAILED DESCRIPTION OF THE INVENTION

A conventional micro-LED chip may include a light emitting chip and a driving backplane. Due to the incompatibility of the process flows, the light emitting chip and the driving backplane need to be manufactured separately. After the light emitting chip and the driving backplane are separately manufactured, the electrodes of the light emitting chip can be welded to electrode of the driving backplane to drive the light emitting chip to emit light.

The applicant finds that because the sizes of the electrode the LED chip and the electrode of the driving backplane are very small, it is difficult to effectively weld the electrode of the LED chip and the electrode of the driving backplane, thus affecting the performance of the micro-LED chip.

In practical application, the electrode of the light emitting chip and the electrode of the driving backplane are usually welded by reverse welding.

Figure 1:
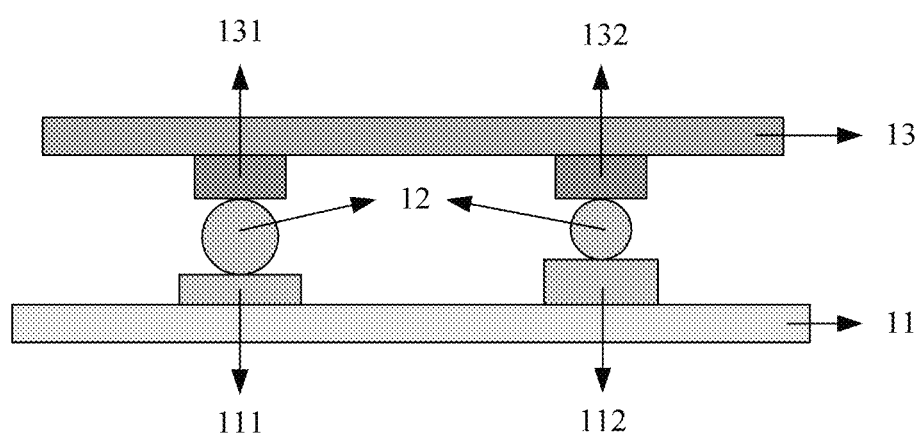
FIG. 1 is a schematic diagram of a micro-LED chip.

Specifically, the driving backplane includes at least one first electrode, and the light emitting chip includes at least one second electrode. As shown in FIG. 1, first, a solder 12 can be manufactured on the first electrode 111 and the first electrode 112 of driving backplane 11. Then, the light emitting chip 13 is inverted, and the second electrode 131 and the second electrode 132 of the light emitting chip 13 are aligned with the first electrode 111 and the first electrode 112 of the driving backplane 11, respectively. Finally, welding is performed at high temperature and high pressure, so as to realize an electrical connection between the second electrode 131 with the second electrode 132 of the light emitting chip 13 and the first electrode 111 with the first electrode 112 of the driving backplane 11.

In practical application, however, because the heights of the plurality of first electrodes of the driving backplane varies greatly, when the second electrodes of the light emitting chip and the first electrodes of the driving backplane are aligned and welded, some of the first electrodes are close to the corresponding second electrode, while some of the first electrodes are far from the corresponding second electrode. As such, for the first electrodes of the driving backplane which are far from the second electrode of the light emitting chip, it is easy to cause poor soldering and other phenomena, thus affecting the performance of the micro-LED chip.

For the first electrodes of the driving backplane far from the second electrodes of the light emitting chip, the effective connection between the first electrode and the second electrode may also be ensured by coating more solder. However, due to the small size of the light emitting chip, excessive solder is easily contacted with the surrounding first electrodes or second electrodes, resulting in a short circuit between the first electrodes or second electrodes, thereby affecting the performance of the micro-LED chip.

Therefore, it is difficult to effectively weld the second electrodes of the light emitting chip and the first electrodes of the driving backplane in the micro-LED chip.

Accordingly, exemplary embodiments of the present disclosure provide a micro-LED chips and methods for manufacturing the micro-LED chip and display devices, which can effectively address the foregoing problem that second electrodes of the light emitting chip and first electrodes of the driving backplane in the micro-LED chip cannot be effectively welded.

The following clearly and completely describes the technical solutions of the present disclosure with reference to the specific embodiments of the present disclosure and the corresponding accompanying drawings. Obviously, the described embodiments are only some rather than all of the embodiments of the disclosure. Based on the embodiments of the present disclosure, all other embodiments obtained by a person of ordinary skill in the art without creative efforts fall within the protection scope of the present disclosure.

The driving backplane described in the exemplary embodiments of the disclosure may be a TFT backplane, and the light emitting chip may be a micro-LED light emitting chip. A plurality of first electrodes (including anodes and cathodes) may be distributed on one side of the driving backplane, and a plurality of second electrodes (including anodes and cathodes are also distributed on one side of the light emitting chip. When manufacturing the micro-LED chips, the anodes and cathodes of the driving backplane need to be connected to the anodes and cathodes of the light emitting chip, respectively.

Generally, the size of the first electrode in the driving backplane and the size of the second electrode in the light emitting chip are about dozens of microns. It is difficult to effectively weld the first electrodes in the driving backplane and the second electrodes in the light emitting chip by direct welding. The technical solutions provided in the exemplary embodiments of the disclosure can effectively improve the contact performance between the first electrodes of the driving backplane and the second electrodes of the light emitting chip, and improve the reliability of the connection between the first electrodes and the second electrodes.

The following describes in detail the technical solutions provided in the embodiments of the present disclosure with reference to the accompanying drawings.

Figure 2:
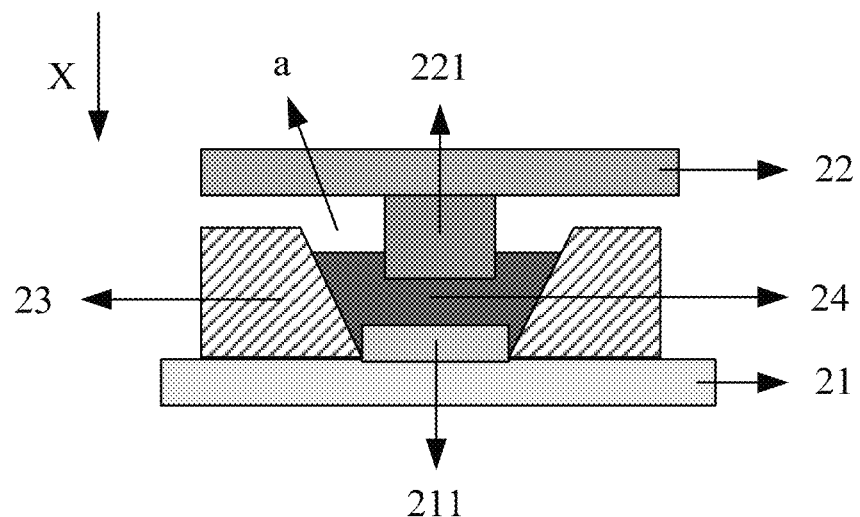
FIG. 2 is a schematic diagram of a micro-LED chip according to an exemplary embodiment of the disclosure.

FIG. 2 is a schematic diagram of a micro-LED chip according to an exemplary embodiment of the disclosure. The structure of the micro-LED chip is described below.

In FIG. 2, the micro-LED chip includes a driving backplane 21 and a light emitting chip 22. The driving backplane 21 includes a first electrode 211, and the light emitting chip 22 includes a second electrode 221.

A groove a is provided above the first electrode 211 of the driving backplane 21, and the first electrode 211 is exposed at a bottom of the groove a. The formation process of the groove a may include: coating a photoresist 23 on the first electrode 211 of the driving backplane 21, and patterning the photoresist 23 at the first electrode 211 to form the groove a.

Figure 4:
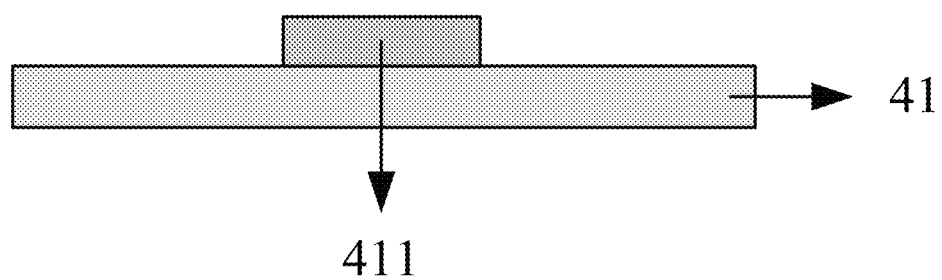
FIGS. 4 to 10 are schematic diagrams of a method for manufacturing a micro-LED chip according to exemplary embodiments of the disclosure.

The groove a is filled with a conductive material 24. The conductive material 24 is cured by a conductive ink corresponding to the conductive material 24. The conductive ink can be printed into the groove a by ink jet printing. In FIG. 4, the height of the conductive material 24 in the groove a is less than the depth of the groove a, that is, in a plane perpendicular to the surface of the driving backplane 21, the distance of the conductive material 24 from the surface of the driving backplane 21 to the driving backplane 21 is less than the distance of the groove a from the top of the driving backplane 21 to the driving backplane 21.

In practical application, a plurality of grooves are formed at the first electrodes of the backplane (FIG. 2 shows only one groove a). The top of the different grooves may be in the same horizontal plane. As such, when the conductive ink is printed into the groove, it can be ensured that the conductive ink is on the same horizontal plane, such that the first electrode of the driving backplane is connected to the second electrode of the light emitting chip on the same horizontal plane under the action of the conductive ink. When the second electrode of the light emitting chip is connected to the first electrode of the driving backplane, the second electrode of the light emitting chip can be effectively connected to the first electrode of the driving backplane by the conducting ink on the same horizontal plane, thereby solving the problem that the plurality of first electrodes of the driving backplane cannot be effectively connected to the second electrodes of the light emitting chip due to the large height difference between the first electrodes.

For one of the grooves, in an exemplary embodiment, the shape of a cross-section of the groove a in a direction (i.e., the X direction in FIG. 2) of the thickness of the driving backplane 21 is trapezoidal. Thus, the stability and reliability of the connection between the first electrode 211 and the second electrode 221 can be improved. In other exemplary embodiments, the shape of the cross-section may also be arcuate, rectangular, or other polygons.

In FIG. 2, the first electrode 211 of the driving backplane 21 may be connected directly to the second electrode 221 of the light emitting chip 22 through the conductive material 24 in the groove a. As such, the second electrode 221 of the light emitting chip 22 is connected to the first electrode 211 of the driving backplane 21 by the conductive material 24 obtained by curing. Compared with directly welding the first electrode of the driving backplane to the second electrode of the light emitting chip, as the first electrode and the second electrode are in good contact with the cured conductive material, the contact performance between the first electrode and the second electrode can be effectively improved, and the reliability of connection between the first electrode and the second electrode can be improved.

Figure 3:
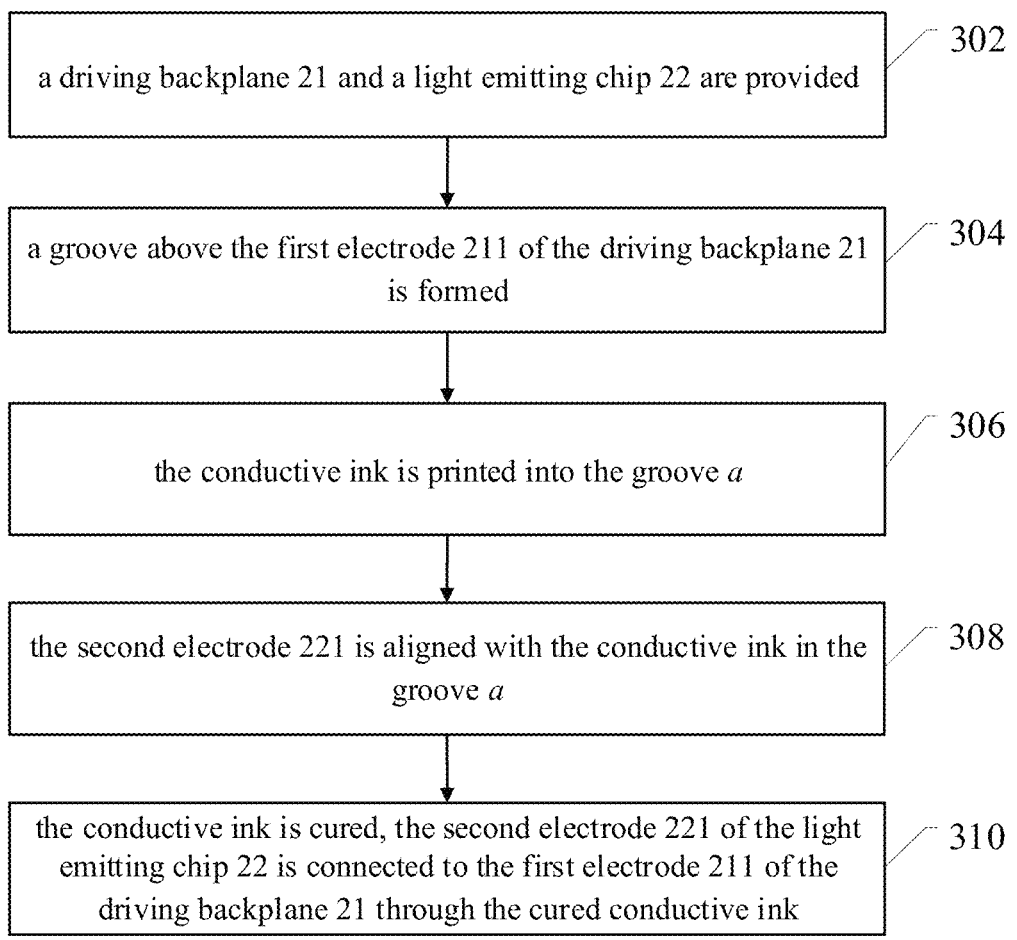
FIG. 3 is a flowchart of a method for manufacturing a micro-LED chip according to an exemplary embodiment of the disclosure.

In order to manufacture the micro-LED chip described in the exemplary embodiments of the disclosure, an exemplary embodiment of the disclosure further provides a method for manufacturing the micro-LED chip. The flow chart of the method for manufacturing the micro-LED chip may be shown in FIG. 3. The manufacturing method shown in FIG. 3 can manufacture and obtain the micro-LED chip shown in FIG. 2. The manufacturing method includes the following steps:

At step 302, a driving backplane 21 and a light emitting chip 22 are provided.

In manufacturing the micro-LED chip, a driving backplane 21 and a light emitting chip 22 for manufactured and obtained micro-LED chip may be provided, the driving backplane 21 may be a TFT backplane, and the light emitting chip 11 may be a micro-LED light emitting chip. The driving backplane 21 includes at least one first electrode 211 and the light emitting chip 11 includes at least one second electrode 221.

The method for producing the micro-LED chip provided in the exemplary embodiment of the disclosure may be used to connect the first electrode 211 of the driving backplane 21 to the second electrode 221 of the light emitting chip 22.

At step 304, a groove above the first electrode 211 of the driving backplane 21 is formed.

In step 304, when the second electrode 221 of the light emitting chip 22 is connected to the first electrode 211 of the driving backplane 21, a groove a may be formed above the first electrode 211 of the driving backplane 21 (that is, on the side where the first electrode 211 of the driving backplane 21 is located).

The forming the groove above the first electrode 211 of the driving backplane 21 includes forming a groove a above each of the first electrodes 211. For one of the first electrodes 211 and the groove formed above the first electrode 211, the bottom of the groove a needs to expose the first electrode 211. The groove a may expose a part of the first electrode 211 or all of the first electrode 211.

The shape of the cross-section of the groove in the direction of the thickness of the driving backplane 21 may be arcuate, rectangular, trapezoidal, or other polygons. Optionally, the trapezoid may be a positive trapezoid (upper narrow and lower wide) or an inverse trapezoid (upper narrow and lower narrow), which improves the stability and reliability of the connection between the first electrode 211 and the second electrode 221.

In the exemplary embodiment of the disclosure, the driving backplane 21 may include a plurality of first electrodes 211, and a plurality of grooves a may be formed on the plurality of first electrodes 211 of the driving backplane 21. The tops of the different grooves a may be on the same horizontal plane. As such, when the conductive material 24 is subsequently filled in the groove a, it can be ensured that the conductive material 24 is on the same horizontal plane. When the second electrode 221 of the light emitting chip 22 is connected to the first electrode 211 of the driving backplane 21, the second electrode 221 of the light emitting chip 22 can be effectively connected to the first electrode 211 of the driving backplane 21 by the conductive material 24 on the same horizontal plane, thereby solving the problem that the plurality of first electrodes 211 of the driving backplane 21 cannot be effectively connected to the second electrodes 221 of the light emitting chip 22 due to the large height difference between the first electrodes 211.

In an exemplary embodiment of the disclosure, the forming the groove a above the first electrode 211 of the driving backplane 21 may include as follows:

A photoresist is applied on the first electrode 211 of the driving backplane 21.

The photoresist is patterned to form the groove a at the first electrode 211 of the driving backplane 21, and the bottom of the groove a exposes the first electrode 211 of the driving backplane 21.

Specifically, first, the photoresist may be applied on the first electrode 211 of the driving backplane 21. One side of the photoresist away from the driving backplane 21 may be a plane, such that the top of the subsequent groove a can be ensured to be on the same horizontal plane.

The photoresist can then be patterned. The specific steps of patterning may include exposure, development, and cleaning. When the photoresist is exposed, the exposed area may be the area where the first electrode 211 of the driving backplane 21 is located. The photoresist after exposure can be developed and cleaned in turn.

Finally, the photoresist can form a groove a at the first electrode 211 of the driving backplane 21. The bottom of the groove a exposes the first electrode 211 of the driving backplane 21.

Step 306 may be performed after the groove a is formed above the first electrode 211 of the driving backplane 21 by the method described above.

At step 306, the conductive ink is printed into the groove a.

The conductive ink can be referred as a mixture of conductive materials 24 and liquids. Optionally, the conductive ink may be a nano silver wire conductive ink. The cured silver wire conductive ink has good contact with the first electrode 211 and the second electrode 221, which can effectively improve the contact performance between the second electrode 221 of the light emitting chip 22 and the first electrode 211 of the driving backplane 21, and improve the reliability of connection between the first electrode 211 and the second electrode 221. Alternatively, the conductive ink may be a nano-copper wire conductive ink. The conductive ink may also be conductive ink of other conductive materials, which is not illustrated hereto.

In an exemplary embodiment of the present disclosure, the conductive ink may be printed directly into the groove a when printing the conductive ink into the groove a. The conductive ink can be printed into the groove a by ink jet printing. Specifically, the conductive ink can be placed in the ink cartridge of the printer, and the jet head with high printing accuracy and less plugging can be selected for printing.

In another exemplary embodiment of the present disclosure, the printing conductive ink into a groove a may include:

A conductive ink precursor is printed into the groove a.

The conductive ink was obtained by photon sintering the conductive ink precursor.

In this embodiment, the conductive ink may not be directly printed in the groove a. In an exemplary embodiment, the conductive ink precursor corresponding to the conductive ink is first printed in the groove a. Then, the conductive ink precursor is photon sintered to obtain the conductive ink, so as to print the conductive ink into the groove a. The laser can be used in photon sintering.

In this embodiment, the printing may also be performed by ink jet printing when printing the conductive ink precursor.

In actual application, any one of the foregoing manners may be selected to print the conductive ink into the groove. If the ink jet printing manner is used to print the conductive ink into the groove, the printing manner may be determined according to the size of the diameter of the nozzle.

Specifically, when the diameter of the nozzle is small, it is possible to print the conductive ink precursor and form the conductive ink by photon sintering. As such, it is possible to avoid the problem of nozzle aperture blocking caused by direct printing of conductive ink. When the diameter of the nozzle is large, it is possible to select to directly print the conductive ink. As such, the process flow can be simplified compared with printing the conductive ink precursor.

In the exemplary embodiment of the disclosure, when the conductive ink or the conductive ink precursor is printed into the groove, the printing may be stopped when the height of the conductive ink or the conductive ink precursor is equal to the set height in order to prevent the conductive ink or the conductive ink precursor from overflowing into the groove. The set height is less than the height of the top of the groove, which may be specifically determined according to actual conditions.

For example, when the height of the top of the groove is 15 microns to 20 microns, the set height may be 10 microns to 15 microns. The set height can be determined according to the concentration of conductive ink (or of the conductive ink precursor). For example, when the concentration of the conductive ink is high, the set height may be relatively low (for example, less than 50% of the height at the top of the groove), and when the concentration of the conductive ink is low, the set height may be relatively high (for example, between 60% and 90% of the height at the top of the groove).

After the electrically conductive ink is printed into the groove by the above described method, step 308 may be performed.

At step 308, the second electrode 221 is aligned with the conductive ink in the groove a.

In step 308, when the second electrode 221 of the light emitting chip 22 is aligned to and contacting with the conductive ink in the groove a, the second electrode 221 of the light emitting chip 22 may first be placed above the groove a. Then, the second electrode 221 of the light emitting chip 22 is aligned with the conductive ink and immersed in the conductive ink, thus ensuring a full contact between the second electrode 221 of the light emitting chip 22 and the conductive ink.

When the second electrode 221 of the light emitting chip 22 is immersed in the conductive ink in the groove a, a part of the second electrode 221 of the light emitting chip 22 may be immersed in the conductive ink so as to prevent the conductive ink from overflowing.

Before immersing the second electrode 221 of the light emitting chip 22 into the conductive ink, the second electrode 221 of the light emitting chip 22 may not be coated with solder.

Step 310 may be performed after the second electrode 221 of the light emitting chip 22 is aligned to and contacting with the conductive ink in the groove.

At step 310, the conductive ink is cured, the second electrode 221 of the light emitting chip 22 is connected to the first electrode 211 of the driving backplane 21 through the cured conductive ink.

In step 310, curing the conductive ink may be referred as evaporating away the liquid in the conductive ink while retaining the conductive material in the conductive ink.

In an exemplary embodiment of the disclosure, curing the conductive ink may include:

The conductive ink is treated by infrared sintering, and the conductive ink is converted into the conductive material 24, such that the second electrode 221 of the light emitting chip 22 is connected to the first electrode 211 of the driving backplane 21 by the conductive material.

Taking conductive ink as nano-silver wire ink as an example, after the nano-silver wire conductive ink is infrared sintered, the liquid in the nano-silver wire conductive ink can be evaporated. The nano-silver wire may be connected together at the head and tail, and the second electrode 221 of the light emitting chip 22 is connected to the first electrode 211 of the driving backplane 21. The whole process of the infrared sintering can be regarded as the process of curing the nano-silver wire ink.

For ease understanding of the entire technical solution, see FIGS. 4 to 10. FIGS. 4 to 10 are schematic diagrams of a method for manufacturing a micro-LED chip according to an exemplary embodiments of the disclosure.

FIG. 4 is a schematic diagram of the driving backplane. In FIG. 4, the first electrode 411 is disposed on a side of the driving backplane 41 where the first electrode is located.

Figure 5:
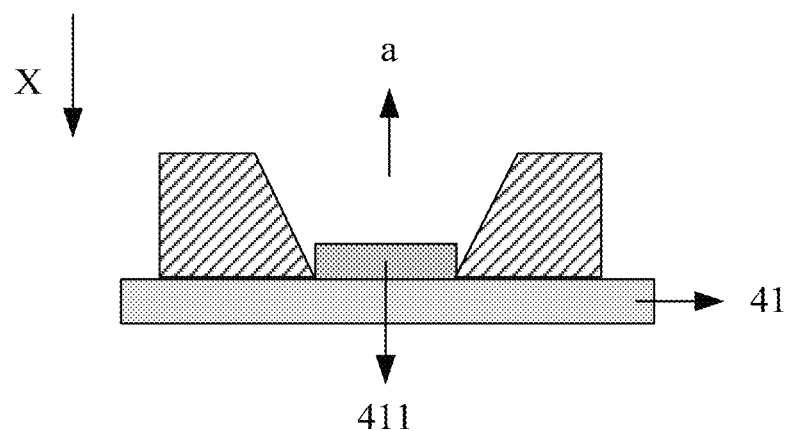

In FIG. 5, a groove a is formed above the first electrode 411 of the driving backplane 41, the bottom of the groove a exposes the first electrode 411. The shape of the cross-section of the groove a is a trapezoid in the direction (X-direction) of the thickness of the driving backplane 41, and the trapezoid shape is upper wide and lower narrow. This facilitates subsequent printing of conductive ink (or of the conductive ink precursor). For a specific forming process of forming the groove a, reference may be made to related content described in the embodiment shown in FIG. 3, which is omitted for brevity herein.

Figure 6:
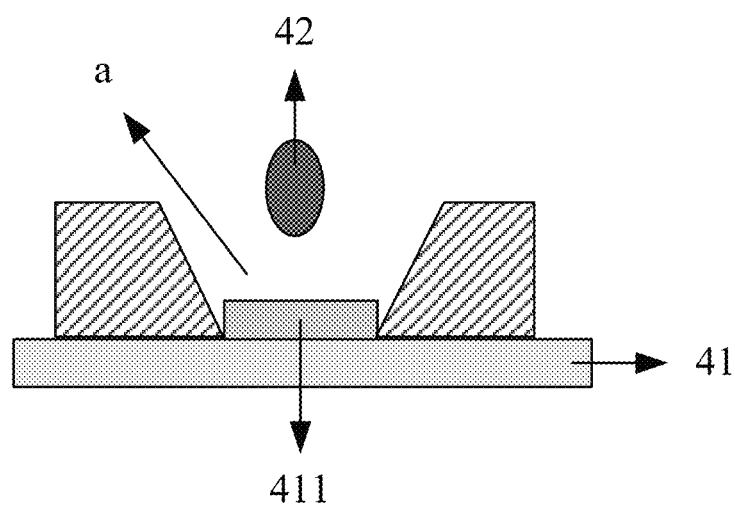

Referring to FIG. 6, in an exemplary embodiment of the present disclosure, after the groove a is formed above the first electrode 411 of the driving backplane 41, the nano-silver conductive ink 42 may be printed into the groove a by ink jet printing. When the height of the silver wire conductive ink 42 is equal to the set height, the printing is stopped. The set height is less than the height of the top of the groove a, which may be specifically determined according to the actual conditions, which is not specifically limited herein.

Figure 7:
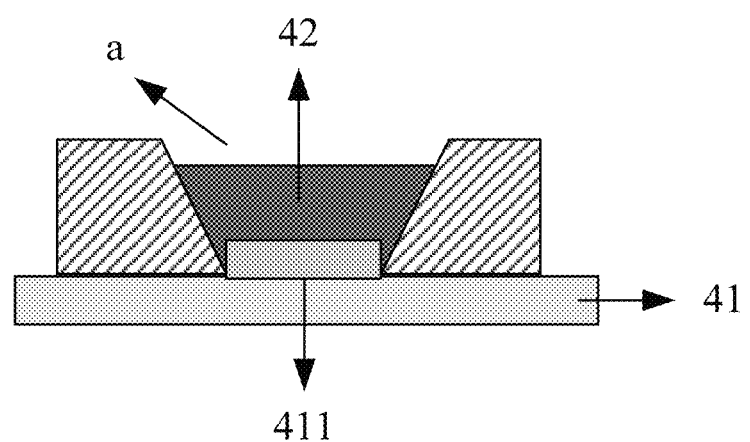

As shown in FIG. 7, the nanowire conductive ink 42 is filled in the groove a, and the height of the nanowire conductive ink 42 is lower than the height of the top of the groove a.

Figure 8:
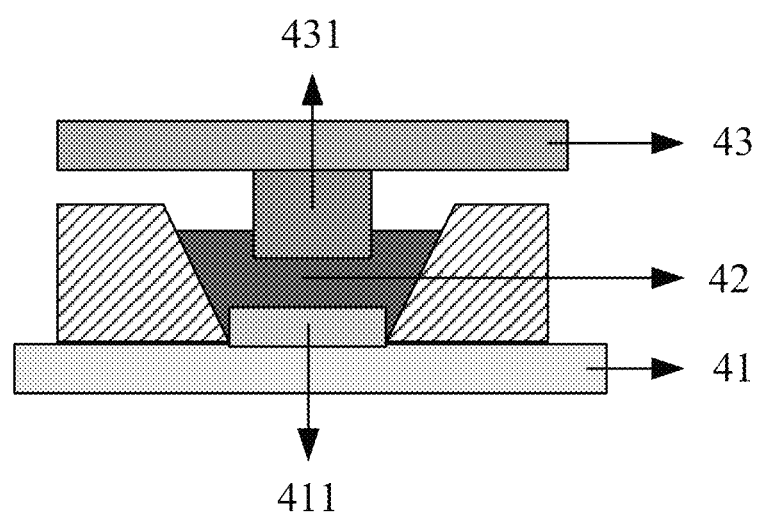

In FIG. 8, the second electrode 431 of the light emitting chip 43 may be aligned to the nanowire conductive ink 42 in the groove a, and a portion of the second electrode 431 may be immersed in the nanowire conductive ink 42. Then, the nano-silver wire conductive ink 42 can be treated by infrared sintering, and the liquid in the nano-silver wire conductive ink 42 can be evaporated, the head and end of the nano-silver wire are overlapped, and the second electrode 431 of the light emitting chip 43 is connected to the first electrode 411 of the driving backplane 41.

Figure 9:
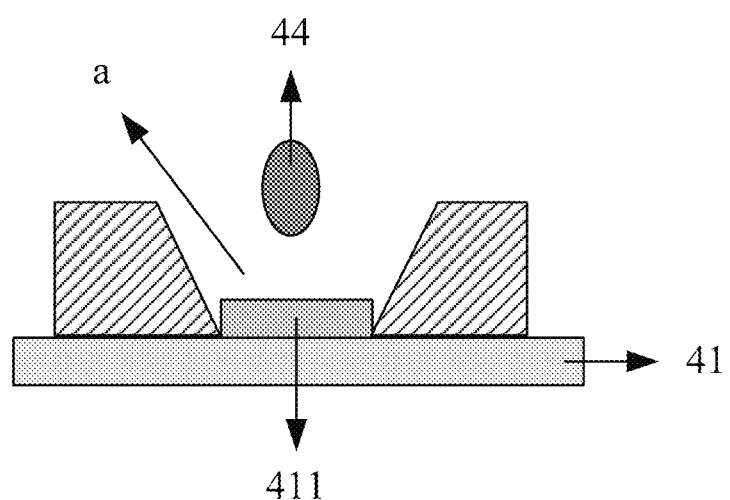

Referring to FIG. 9, in another exemplary embodiment of the present disclosure, after the groove a is formed above the first electrode of the driving backplane 41, the nano-silver wire conductive ink precursor 44 may be printed into the groove a by ink jet printing. When the height of the nano-silver wire conductive ink precursor 44 is equal to the set height, the printing is stopped. The set height is less than the height of the top of the groove a, which may be specifically determined according to the actual conditions, which is not specifically limited herein.

Figure 10:
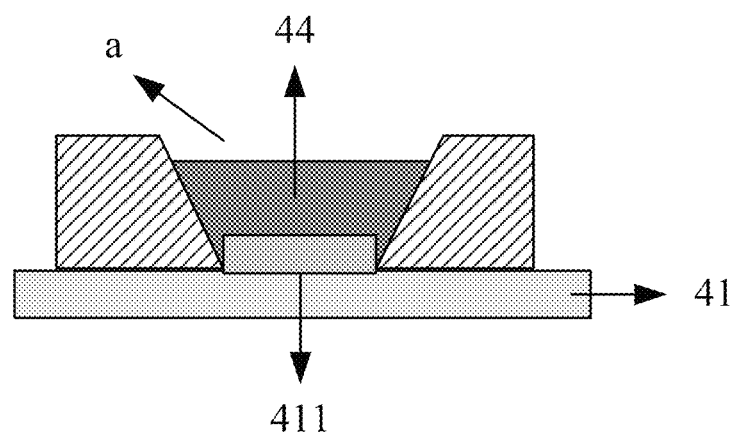

As shown in FIG. 10, the nano-silver wire conductive ink precursor 44 is filled in the groove a, and the height of the nano-silver wire conductive ink precursor 44 is lower than the height of the top of the groove a.

After printing nano-silver wire conductive ink precursor 44 in groove a, the nano-silver wire conductive ink precursor 44 can be photon sintered to obtain the nano-silver wire conductive ink 42, as shown in FIG. 7.

Then, the second electrode of the light emitting chip may be connected to the first electrode of the driving backplane 41 through the nano silver wire conductive ink in the groove a. For details, reference can be made to FIG. 8, which is omitted for brevity.

In the foregoing described FIG. 5, the nano silver wire conductive ink 42 printed in the groove a may also be replaced by a nano copper wire conductive ink, or may be a conductive ink of another conductive material. In FIG. 9, the nano-silver wire conductive ink precursor 44 printed in the groove a may also be replaced by a nano-copper wire conductive ink precursor, or may be another conductive ink precursor, which is not illustrated herein.

The method for manufacturing micro-LED chips provided in the exemplary embodiments of the disclosure can achieve at least the following beneficial effects:

(1) By forming a groove above the side of the first electrode side of the driving backplane, and printing the conductive ink into the groove, the second electrode of the light emitting chip is connected to the first electrode of the driving backplane by the conductive material formed after curing the conductive ink. Compared with directly welding the second electrode of the light emitting chip to the first electrode of the driving backplane, the first electrode and the second electrode have better contact with the cured conductive material. Therefore, the contact performance between the second electrode of the light emitting chip and the first electrode of the driving backplane can be effectively improved, and the reliability of connection between the first electrode and the second electrode can be improved.

(2) By printing the conductive ink into the groove, the groove can protect the cured conductive material from falling off.

(3) The alignment accuracy is high and the electrode connection is less than 20 micron.

(4) The height of the conductive ink printed in different grooves may be at the same level when printing the conductive ink into the grooves above the side where the first electrode of the driving backplane is located. As such, when the second electrode of the light emitting chip is connected to the first electrode of the driving backplane, the second electrode of the light emitting chip can be effectively connected to the first electrode of the driving backplane by conducting ink on the same horizontal plane, thereby solving the problem that the plurality of first electrodes of the driving backplane cannot be effectively connected to the second electrodes of the light emitting chip due to the large height difference between the first electrodes.

An exemplary embodiment of the disclosure further provides a display device, and the display device may include a micro-LED chip manufactured according to the micro-LED chip of the foregoing embodiment or by the foregoing described method for manufacturing the micro-LED chip.

Although preferred embodiments of the present disclosure have been described, those skilled in the art may make additional changes and modifications to these embodiments once they are aware of the basic creative concept. The appended claims are therefore intended to be construed as including preferred embodiments and all changes and modifications falling within the scope of the disclosure.

It is evident that a person skilled in the art may make various changes and variations to the disclosure without departing from the scope of the disclosure. Thus, if these modifications and variations of the present disclosure fall within the scope of the claims of the present disclosure and their equivalents, the present disclosure is also intended to include these modifications and variations.

The invention claimed is:

1. A micro-LED chip, comprising:
    a driving backplane comprising at least one first electrode, at least a groove provided above the first electrode, and the first electrode located at a bottom of the groove, the groove being filled with a conductive material, the conductive material being obtained by curing a corresponding conductive ink; and a light emitting chip comprising a second electrode;
wherein the first electrode is connected to the second electrode through the conductive material.

2. The micro-LED chip according to claim 1, wherein the driving backplane comprises a plurality of first electrodes, a plurality of grooves, the plurality of the grooves being formed above the plurality of first electrodes, respectively, and tops of the grooves are located above a same horizontal plane.

3. The micro-LED chip according to claim 1, wherein a height of the conductive material filled in the groove is less than a depth of the groove.

4. The micro-LED chip according to claim 1, wherein a shape of a cross-section of the groove in a direction of a thickness of the driving backplane is arcuate, rectangular, or trapezoidal.

5. The micro-LED chip according to claim 1, wherein the conductive ink is a nano silver wire conductive ink or a nano copper wire conductive ink.

6. A method for manufacturing a micro-LED chip, comprising:
providing a driving backplane and a light emitting chip, wherein the driving backplane comprises a first electrode, and wherein the light emitting chip comprises a second electrode;
forming at least a groove above the first electrode, wherein the first electrode is exposed at a bottom of the groove;
printing a conductive ink into the groove;
aligning and contacting the second electrode with the conductive ink in the groove; and
curing the conductive ink, the second electrode being connected to the first electrode through the cured conductive ink.

7. The method according to claim 6, wherein the backplane comprises a plurality of first electrodes, and the forming the groove above the first electrode comprises:
forming a plurality of the grooves above the plurality of first electrodes, wherein tops of different grooves are located above the same horizontal plane.

8. The method according to claim 7, wherein a shape of a cross-section of the groove in a direction of a thickness of the driving backplane is arcuate, rectangular, or trapezoidal.

9. The method according to claim 6, wherein the forming the groove above the first electrode comprises:

coating a photoresist on the first electrode; and
patterning the photoresist to form the groove above the photoresist corresponding to the first electrode.

10. The method according to claim 9, wherein the patterning the photoresist comprises:
exposing, developing, and cleaning the photoresist.

11. The method according to claim 6, wherein the printing the printing conductive ink into the groove comprises:
printing the conductive ink into the groove by ink jet printing.

12. The method according to claim 6, wherein the printing the printing conductive ink into the groove comprises:
printing a conductive ink precursor into the groove by ink jet printing; and
photon sintering the conductive ink precursor to obtain the conductive ink.

13. The method according to claim 12, wherein the photon sintering is performed using a laser.

14. The method according to claim 6, wherein the conductive ink is nano silver wire conductive ink or nano copper wire conductive ink.

15. The method according to claim 6, wherein when a height of the conductive ink is equal to a set height, stopping the printing, and the set height is less than a height of a top of the groove.

16. The method according to claim 15, wherein the set height is determined according to a concentration of the conductive ink.

17. The method according to claim 6, wherein the aligning and contacting the second electrode with the conductive ink in the groove comprises:
aligning the second electrode with the conductive ink in the groove, and immersing the second electrode in the conductive ink.

18. The method according to claim 6, wherein curing the conductive ink comprises:
performing infrared sintering treatment to the conductive ink, and converting the conductive ink into a conductive material, the second electrode being connected to the first electrode through the conductive material.

19. A display device, comprising the micro-LED chip according to claim 1.

* * * * *